US009935166B2

(12) United States Patent
Lan et al.

(10) Patent No.: US 9,935,166 B2
(45) Date of Patent: Apr. 3, 2018

(54) CAPACITOR WITH A DIELECTRIC BETWEEN A VIA AND A PLATE OF THE CAPACITOR

(71) Applicant: QUALCOMM Incorporated, San Diego, CA (US)

(72) Inventors: Je-Hsiung Lan, San Diego, CA (US); Chengjie Zuo, Santee, CA (US); Changhan Yun, San Diego, CA (US); David F. Berdy, West Lafayette, IN (US); Daeik D. Kim, San Diego, CA (US); Robert P. Mikulka, Oceanside, CA (US); Mario Francisco Velez, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/833,632

(22) Filed: Mar. 15, 2013

(65) Prior Publication Data

US 2014/0268616 A1 Sep. 18, 2014

(51) Int. Cl.
*H05K 1/16* (2006.01)
*H01L 49/02* (2006.01)
(Continued)

(52) U.S. Cl.
CPC .......... *H01L 28/40* (2013.01); *G06F 17/5068* (2013.01); *H01L 23/49822* (2013.01); *H01L 23/49827* (2013.01); *H01L 27/016* (2013.01); *H01L 28/10* (2013.01); *H01L 28/60* (2013.01); *H01L 23/15* (2013.01); *H01L 27/12* (2013.01); *H01L 2924/0002* (2013.01)

(58) Field of Classification Search
CPC ....... H01L 28/40; H01L 23/498; H01L 23/15; H01L 23/66; H01L 2924/0002; H01L 23/49822; H01L 23/49827; H01F 17/00; G06F 17/5068
USPC ........................................................ 174/260
See application file for complete search history.

(56) References Cited

U.S. PATENT DOCUMENTS 2,757,320 A 7/1956 Schuh, Jr.
3,656,162 A 4/1972 Mee
(Continued)

FOREIGN PATENT DOCUMENTS

CN 101697305 A 4/2010
CN 102956606 A 3/2013
(Continued)

OTHER PUBLICATIONS

Buisman, et al., ""Distortion-Free" Varactor Diode Topologies for RF Adapativity," 2005 IEEE MTT-S International Microwave Symposium Digest, 2005, pp. 157-160.
(Continued)

*Primary Examiner* — Steven T Sawyer
(74) *Attorney, Agent, or Firm* — Qualcomm Incorporated-Toler

(57) ABSTRACT

In a particular embodiment, a device includes a substrate, a via that extends at least partially through the substrate, and a capacitor. A dielectric of the capacitor is located between the via and a plate of the capacitor, and the plate of the capacitor is external to the substrate and within the device.

35 Claims, 9 Drawing Sheets

(51) Int. Cl.

| | | |
|---|---|---|
| *G06F 17/50* | (2006.01) | |
| *H01L 23/498* | (2006.01) | |
| *H01L 27/01* | (2006.01) | |
| *H01L 23/15* | (2006.01) | |
| *H01L 27/12* | (2006.01) | |

(56) References Cited

U.S. PATENT DOCUMENTS

| | | | |
|---|---|---|---|
| 5,404,118 A | 4/1995 | Okamura et al. | |
| 5,548,255 A | 8/1996 | Spielman | |
| 5,696,471 A | 12/1997 | Fujiwara | |
| 5,815,052 A | 9/1998 | Nakajima et al. | |
| 5,834,992 A | 11/1998 | Kato et al. | |
| 5,886,597 A | 3/1999 | Riad | |
| 6,180,976 B1 | 1/2001 | Roy | |
| 6,329,604 B1* | 12/2001 | Koya | H05K 1/0219 |
| | | | 174/255 |
| 6,366,564 B1 | 4/2002 | Hiraka et al. | |
| 6,597,258 B2 | 7/2003 | Rosenbaum | |
| 6,597,315 B2 | 7/2003 | Yokoshima et al. | |
| 7,498,918 B2 | 3/2009 | Hsu et al. | |
| 7,564,319 B2 | 7/2009 | Ding et al. | |
| 7,586,755 B2* | 9/2009 | Satoh et al. | 361/782 |
| 7,678,695 B2 | 3/2010 | Taniguchi et al. | |
| 7,812,702 B2* | 10/2010 | Mano | H01F 17/0006 |
| | | | 336/200 |
| 7,821,359 B2 | 10/2010 | Hart | |
| 7,924,116 B2 | 4/2011 | Ono et al. | |
| 8,069,560 B2 | 12/2011 | Mori et al. | |
| 8,324,984 B2 | 12/2012 | Gavin et al. | |
| 8,339,233 B2 | 12/2012 | Tsai et al. | |
| 8,362,591 B2 | 1/2013 | Yen et al. | |
| 8,736,399 B2 | 5/2014 | Solski et al. | |
| 8,803,615 B2 | 8/2014 | Cabanillas et al. | |
| 2001/0044292 A1 | 11/2001 | Jeon et al. | |
| 2004/0124961 A1 | 7/2004 | Aoyagi | |
| 2007/0257761 A1 | 11/2007 | Mano et al. | |
| 2008/0121417 A1 | 5/2008 | Fan | |
| 2008/0166980 A1 | 7/2008 | Fukamachi et al. | |
| 2009/0179722 A1* | 7/2009 | Goyette | H05K 1/165 |
| | | | 336/186 |
| 2009/0219908 A1 | 9/2009 | Rofougaran | |
| 2009/0225525 A1 | 9/2009 | Mano et al. | |
| 2009/0288872 A1* | 11/2009 | Kim | H05K 1/0265 |
| | | | 174/262 |
| 2010/0289126 A1 | 11/2010 | Pagaila et al. | |
| 2010/0309606 A1* | 12/2010 | Allers | H01L 23/5223 |
| | | | 361/306.3 |
| 2011/0095395 A1 | 4/2011 | Ellul et al. | |
| 2011/0110385 A1 | 5/2011 | Gorostegui et al. | |
| 2011/0140825 A1* | 6/2011 | Kim | H01F 17/0006 |
| | | | 336/207 |
| 2011/0248405 A1 | 10/2011 | Li et al. | |
| 2011/0291786 A1* | 12/2011 | Li | H01F 21/08 |
| | | | 336/200 |
| 2012/0075216 A1 | 3/2012 | Black et al. | |
| 2012/0080771 A1 | 4/2012 | Yang et al. | |
| 2012/0302188 A1 | 11/2012 | Sahota et al. | |
| 2013/0011995 A1 | 1/2013 | Watanabe | |
| 2013/0207745 A1 | 8/2013 | Yun et al. | |
| 2013/0223412 A1 | 8/2013 | Sambhwani | |
| 2014/0197902 A1 | 7/2014 | Zuo et al. | |
| 2014/0247064 A1* | 9/2014 | Rabe | G01R 31/2843 |
| | | | 324/750.01 |
| 2014/0327496 A1 | 11/2014 | Zuo et al. | |
| 2014/0354372 A1 | 12/2014 | Zuo et al. | |

FOREIGN PATENT DOCUMENTS

| | | |
|---|---|---|
| DE | 102006058068 A1 | 6/2008 |
| DE | 102008003952 A1 | 7/2008 |
| EP | 1411553 A1 | 4/2004 |
| EP | 1833286 A1 | 9/2007 |
| JP | S5291446 U | 7/1977 |
| JP | 2002008942 A | 1/2002 |
| JP | 2003100553 A | 4/2003 |
| JP | 2004087971 A | 3/2004 |
| WO | 9923702 A1 | 5/1999 |
| WO | 2007061308 A1 | 5/2007 |
| WO | 2009118694 A1 | 10/2009 |
| WO | 2009128047 A1 | 10/2009 |
| WO | 2012144482 A1 | 10/2012 |

OTHER PUBLICATIONS

Kim, T.W., et al., "A Compact Sized LTCC Diplexer With High-band Selectivity and High Isolation for GSM and CDMA Multi-band Applications," Asia Pacific Microwave Conference, Dec. 2009, IEEE, Piscataway, NJ, USA, pp. 2080-2083.

Liu, K., et al., "Investigation of Integrated Passive Device With Through-Silicon Via," 62nd Electronic Components and Technology Conference, May 2012, IEEE, Piscataway, NJ, USA, pp. 1833-1839.

Sridharan, V., et al., "Design and Fabrication of Bandpass Filters in Glass Interposer with Through-Package-Vias (TPV)," Proceedings 60th Electronic Components and Technology Conference (ECTC), Jun. 2010, IEEE, Piscataway, NJ, USA, pp. 530-535.

Sun, L., et al., "System Integration Using Silicon-based Integrated Passive Device Technology," International Symposium on Radio-Frequency Integration Technology (RFIT), Nov. 2012, IEEE, Piscataway, NJ, USA, pp. 98-100.

Buisman K., et al., "A Monolithic Low-Distortion Low-Loss Silicon-on-Glass Varactor-Tuned Filter With Optimized Biasing", IEEE Microwave and Wireless Components Letters, IEEE Service Center, New York, NY, US, vol. 17, No. 1, Jan. 1, 2007 (Jan. 1, 2007), pp. 58-60, XP011154487, ISSN: 1531-1309, DOI:10.1109/LMWC.2006.887262 ch. III, 1st paragraph.

International Search Report and Written Opinion for International Application No. PCT/US2014/024118, ISA/EPO, dated Jul. 9, 2014, 11 pages.

Methot F., "Constant Impedance Bandpass and Diplexer Filters", RF Design, Primedia Magazines & Media, vol. 9, No. 11, Nov. 1986 (Nov. 1986), XP001086415, abstract; figure 8(a).

Saitou, K., et al "Tunable duplexer having multilayer structure using LTCC" Microwave Symposium Digest, 2003 IEEE MIT-S International, Philadephia, PA, Jun. 8-13, 2003, vol. 3, pp. 1763-1766.

Sakhnenko S., et al., "Ultra-low-profile small-size LTCC front-end module (FEM) for WLAN applications based on a novel diplexer design approach", Microwave Symposium Digest, 2009, MTT '09, IEEE MTT-S International, IEEE, Piscataway, NJ, USA, Jun. 7, 2009 (Jun. 7, 2009), pp. 609-612, XP031490592, ISBN: 978-1-4244-2803-8, the whole document.

Vitale W.A., et al., "High-Q 3D embedded inductors using TSV for RF MEMS tunable bandpass filters (4.65-6.8 GHz)", IEEE European Microwave Integrated Circuits Conference, Oct. 29, 2012 (Oct. 29, 2012), pp. 822-825, XP032345713, section I, II; figures 1,6.

Shariff, D., et al., "Integration of Fine-Pitched Through-Silicon Vias and Integrated Passive Devices," Electronic Components and Technology Conference, 2011, IEEE, Piscataway, NJ, pp. 844-848.

* cited by examiner

CAPACITOR WITH A DIELECTRIC BETWEEN A VIA AND A PLATE OF THE CAPACITOR

I. FIELD

The present disclosure is generally related to a capacitor.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, may communicate voice and data packets over wireless networks. Further, many such wireless telephones include other types of devices that are incorporated therein. For example, a wireless telephone may also include a digital still camera, a digital video camera, a digital recorder, and an audio file player. Also, such wireless telephones may process executable instructions, including software applications, such as a web browser application, that may be used to access the Internet. As such, these wireless telephones may include significant computing capabilities.

A device (e.g., a diplexer) for use in wireless communication devices may be formed using through-glass-via (TGV) technology to provide smaller size, higher performance, and cost advantages as compared to multi-layer chip diplexer (MLCD) technology. A device formed using TGV technology may include a circuit (e.g. a resonant circuit, such as an inductive-capacitive (L-C) resonator circuit) that may have a capacitor and an inductor. An L-C resonator circuit using TGV technology involves fabrication of an inductor using a partially filled through-glass-via (TGV) structure and a capacitor coupled to the inductor via a metal trace that extends along a substrate from the TGV to the capacitor. The metal trace along the L-C resonator circuit introduces additional resistance, which may degrade overall circuit performance in terms of more power consumption. For example, the increase in the series resistance decreases the quality factor (Q factor) of the resonator circuit, indicating a higher rate of energy loss (or power loss) relative to a stored energy of the circuit.

III. SUMMARY

This disclosure presents particular embodiments of a circuit including a capacitor with a dielectric between a via and a first plate of the capacitor. A solid-filled (or hermetic-filled) via (e.g., TGV) structure may enable the capacitor to be formed on top of the via.

In a particular embodiment, a device includes a substrate, a via that extends at least partially through the substrate, and a capacitor. A dielectric of the capacitor is located between the via and a plate of the capacitor, and the plate of the capacitor is external to the substrate and within the device.

In another particular embodiment, a method includes forming a via that extends at least partially through a substrate of a device and forming a capacitor. A dielectric of the capacitor is located between the via and a plate of the capacitor. The plate of the capacitor is external to the substrate and within the device.

In another particular embodiment, a computer-readable storage device stores instructions that, when executed by a processor, cause the processor to perform operations including initiating formation of a via that extends at least partially through a substrate of a device and initiating formation of a capacitor. A dielectric of the capacitor is located between the via and a plate of the capacitor. The plate of the capacitor is external to the substrate and within the device.

In another particular embodiment, a method includes a step for forming a via that extends at least partially through a substrate of a device and a step for forming a capacitor. A dielectric of the capacitor is located between the via and a plate of the capacitor. The plate of the capacitor is external to the substrate and within the device.

One particular advantage provided by at least one of the disclosed embodiments is that by having a capacitor with a dielectric between a via and a plate of the capacitor, a circuit may have lower power consumption than by having a capacitor that is offset from the via and that is coupled to the via using a metal trace. For example, the disclosed circuit may have a lower resistance by use of the capacitor positioned on the via. The reduced resistance may result in lower power consumption. Further, the quality factor (Q factor) of the circuit may be higher than conventional circuits. The higher quality factor indicates a lower rate of energy loss relative to stored energy of the circuit. In addition, the disclosed circuit may have a smaller size by including the capacitor without the offset from the via.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

Figure 7:
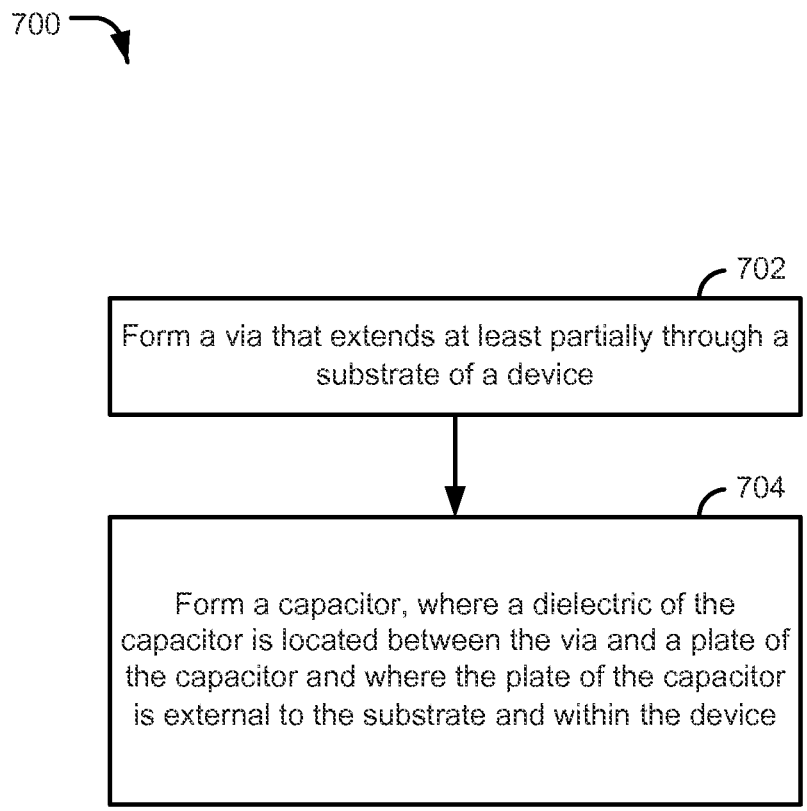
Figure 8:
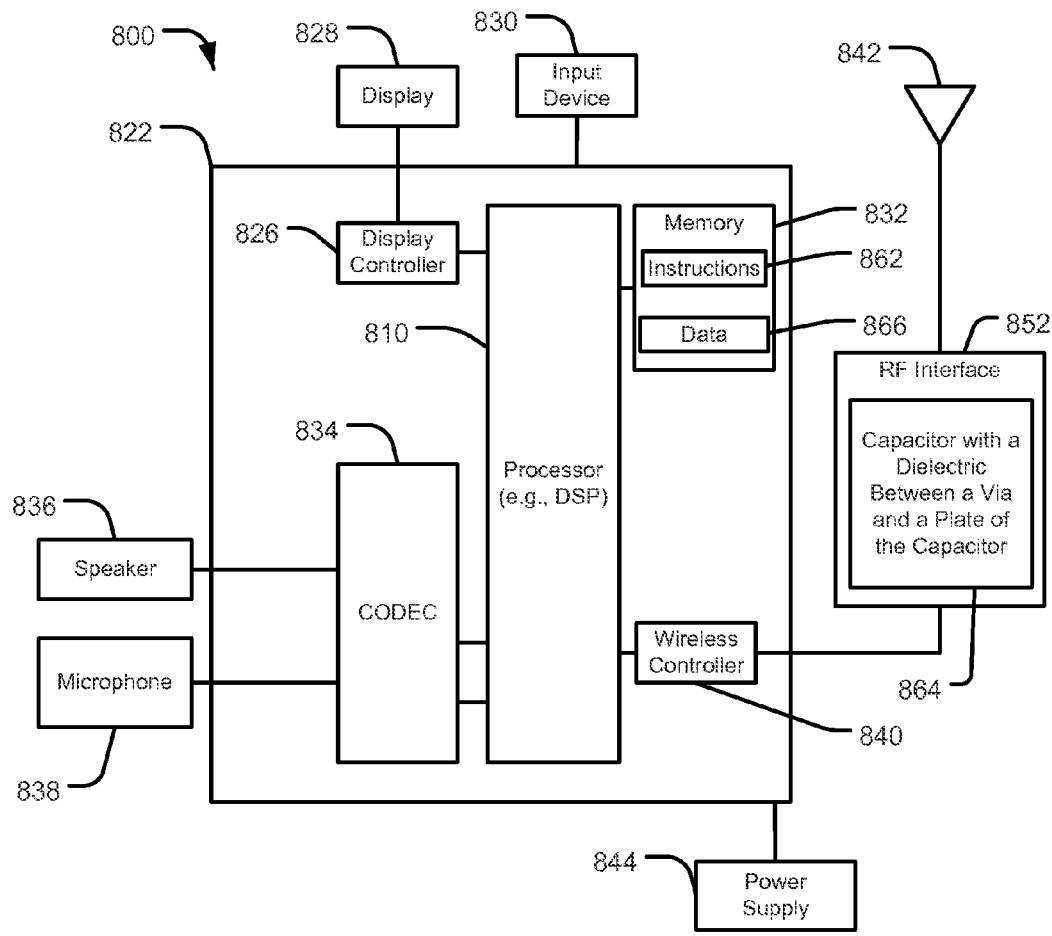
Figure 9:
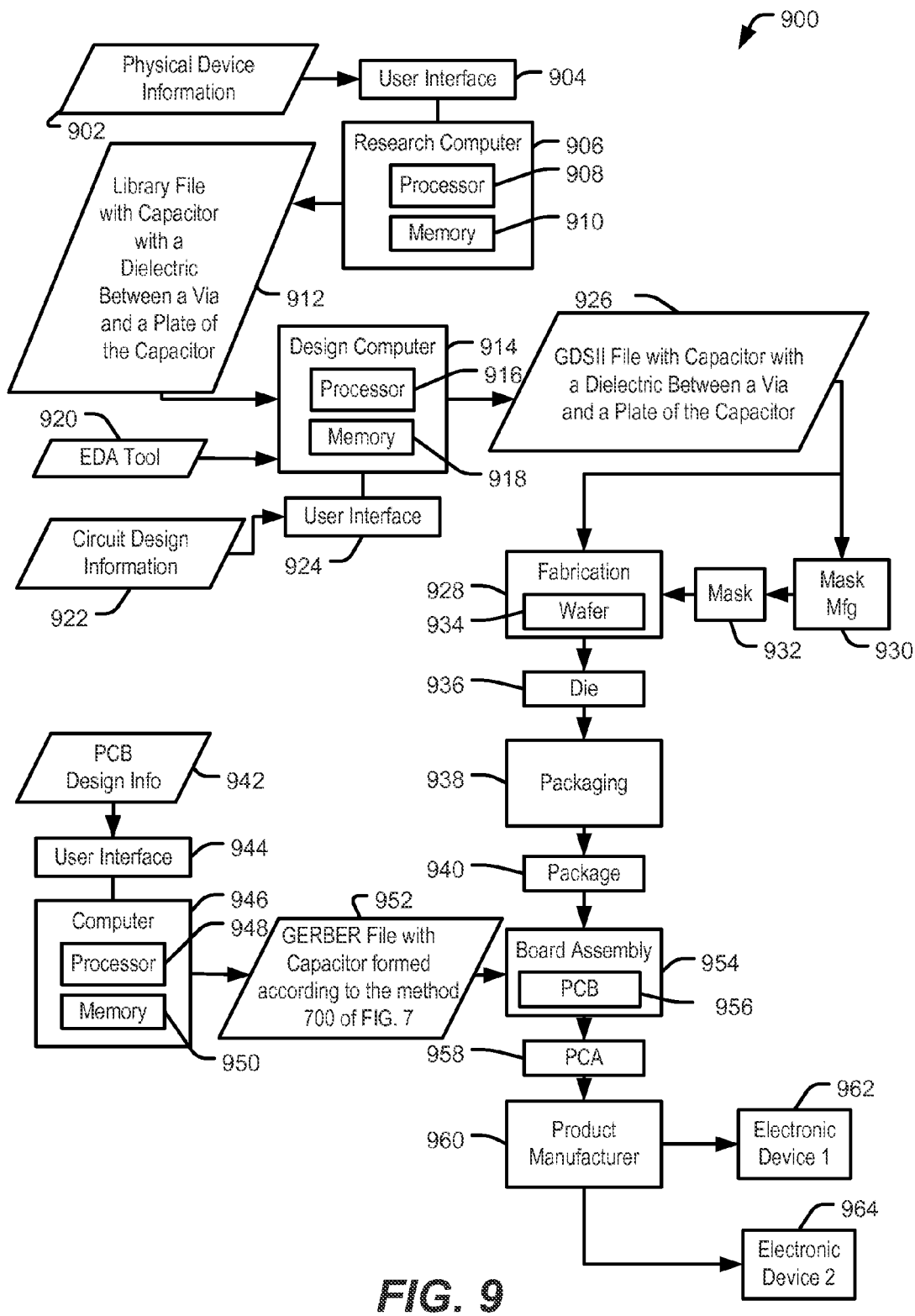

FIG. 7 is a flow chart of a particular illustrative embodiment of a method of forming a capacitor with a dielectric between a via and a plate of the capacitor; and FIG. 8 is a block diagram of a wireless communication device including a capacitor with a dielectric between a via and a plate of the capacitor; and FIG. 9 is a data flow diagram of a particular illustrative embodiment of a manufacturing process to manufacture electronic devices that include a capacitor with a dielectric between a via and a plate of the capacitor.

V. DETAILED DESCRIPTION

Particular embodiments of circuits that include a capacitor with a dielectric between a via and a plate of the capacitor and methods of fabricating circuits are presented in this disclosure. It should be appreciated, however, that the concepts and insights used in the particular embodiments with respect to designs of the circuits may be embodied in a variety of contexts. The particular embodiments presented are merely illustrative, and do not limit the scope of this disclosure.

The present disclosure describes the particular embodiments in specific contexts. However, features, methods, structures or characteristics described according to the particular embodiments may also be combined in suitable manners to form one or more other embodiments. In addition, figures are used to illustrate the relative relationships between the features, methods, structures, or characteristics, and thus may not be drawn in scale. Directional terminology, such as "top", "bottom", "front", "back", etc. is used with reference to the orientation of the figures being described. As such, the directional terminology is used for purposes of illustration and is not meant to be limiting.

Figure 1:
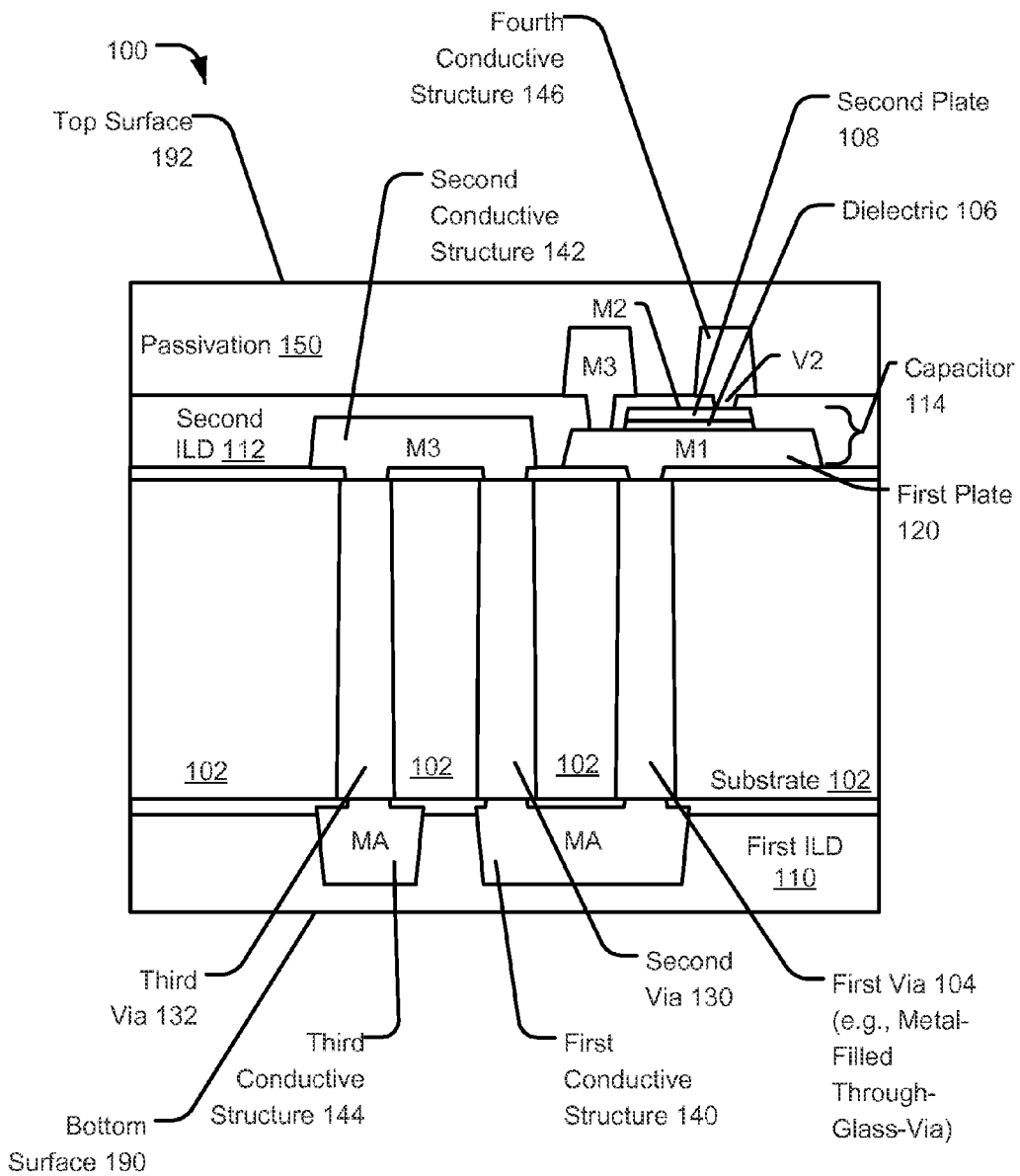
FIG. 1 is a block diagram of a particular illustrative embodiment of a circuit including a capacitor with a dielectric between a via and a plate of the capacitor.

Referring to FIG. 1, a particular illustrative embodiment of a circuit including a capacitor with a dielectric between a via and a plate of the capacitor is disclosed. FIG. 1 shows a cross-sectional view of a portion of a device 100 that includes a circuit.

The device 100 includes a bottom surface 190 and a top surface 192. The device 100 includes a substrate 102. The device 100 may include a first via 104 that extends through the substrate 102 from one side of the substrate 102 to the other side of the substrate 102. The device 100 also includes a capacitor 114. The capacitor 114 includes a dielectric 106 between the first via 104 and a second plate 108 of the capacitor 114.

The substrate 102 may be made of a low-loss material (e.g., dielectric, wide-bandgap semiconductor, etc.). The low-loss material may include a dielectric material or a highly-insulative semiconductor material. In a particular embodiment, the device 100 is a passive device, the substrate 102 includes a glass-type substrate, and the first via 104 includes a through-glass via. The substrate 102 may include a glass substrate, a quartz substrate, a silicon-on-insulator (SOI) substrate, a silicon-on-sapphire (SOS) substrate, a high resitivity substrate (HRS), a gallium arsenide (GaAs) substrate, an indium phosphide (InP) substrate, a silicon carbide (SiC) substrate, an aluminum nitride (AlN) substrate, rogers laminates, or a plastic substrate, as illustrative, non-limiting examples.

The first via 104 may be filled with metal. In a particular embodiment, the metal includes at least one of copper (Cu), tungsten (W), silver (Ag), or gold (Au).

In a particular embodiment, the capacitor 114 includes a second plate 108 (e.g., a second metal layer), the dielectric 106, and a first plate 120 (e.g., a first metal layer). The first plate 120 may be located between the first via 104 and the dielectric 106. The first plate 120 is electrically coupled to the first via 104. The first plate 120 and the second plate 108 are located within the device 100. The dielectric 106 may include at least one of silicon dioxide (SiO2), silicon nitride (Si3N4), silicon oxynitride (SiOxNy), tantalum pentoxide (Ta2O5), aluminum oxide (Al2O3), or aluminum nitride (AlN). The second plate 108 of the capacitor 114 is external to (e.g., above and not embedded within) the substrate 102.

The device 100 may include an inductor that includes the first via 104, a first conductive structure 140 (e.g., a back-side metal layer), a second via 130, a second conductive structure 142 (e.g., a third metal layer), a third via 132, and a third conductive structure 144 (e.g., a back-side metal layer).

The first conductive structure 140 and the third conductive structure 144 may be located in a first inter-layer dielectric (ILD) 110 to electrically insulate the first conductive structure 140 and the third conductive structure 144 from other devices or circuitry. The capacitor 114 and the second conductive structure 142 may be located in a second ILD 112 to electrically insulate the capacitor 114 and the second conductive structure 142 from other devices or circuitry. The second plate 108 may be located between a fourth conductive structure 146 (e.g., a third metal layer) and the dielectric 106. In a particular embodiment, the fourth conductive structure 146 may be located in a passivation layer 150 to electrically insulate the fourth conductive structure 146 from other devices or circuitry.

The inductor and the capacitor 114 may form a resonant circuit. For example, when the capacitor 114 is charged with a first polarity and begins to discharge, an electric current may begin flowing through the inductor. While the capacitor 114 discharges, a magnetic field of the inductor may build as a result of the electric current flowing through the inductor. After the capacitor 114 has discharged, the magnetic field may cause the capacitor 114 to charge with an opposite polarity to the first polarity as flow of the electric current through the inductor reduces. A second electric current in an opposite direction of the electric current may then begin flowing through the inductor as a strength of the magnetic field is reduced. The second electric current may discharge the capacitor 114 and then recharge the capacitor 114 with the earlier polarity. Voltage across the capacitor 114 and the inductor may oscillate at a frequency (e.g., a resonant frequency) approximately equal to a capacitance value of the capacitor 114 multiplied by an inductance value of the inductor. Losses in current due to resistance may dampen oscillations and may reduce efficiency of the circuit.

By having a capacitor 114 with a dielectric 106 between the first via 104 and the second plate 108 of the capacitor 114, a resistance between the first via 104 and the capacitor 114 may be reduced. The first circuit of the device 100 may have lower power consumption than by having a capacitor 114 that is not positioned above the first via 104. For example, the first circuit may have a lower resistance by use of the capacitor 114 without added resistance from a metal line connecting the first via 104 to the capacitor 114. The reduced resistance may result in lower power consumption during use of the first circuit. Further, the quality factor (Q factor) of the first circuit may be higher than conventional circuits. The higher quality factor indicates a lower rate of energy loss relative to stored energy of the first circuit. In addition, the first circuit may have a smaller size by including the capacitor 114 above, rather than beside (or offset from), the first via 104.

It is noted that in the particular embodiments of the present disclosure, film deposition processes, such as chemical vapor deposition (CVD), physical vapor deposition (PVD) (e.g., sputtering or evaporation), and/or electroplating may be used to form metal layers and inter-metal dielectric layers. Photolithography may be used to form patterns of metal layers. An etching process may be performed to remove unwanted materials. Planarization processes such as "etch-back" and chemical-mechanical polishing (CMP) may be employed to create a flat surface.

It is also noted that only a limited number of connectors, inductors, layers, and other structures or devices are shown in the figures of this disclosure for ease of illustration and clarity. Those of ordinary skill in the art will appreciate that, in practice, the device 100 may host a number of connectors, inductors, layers, and other structures or devices.

Figure 2:
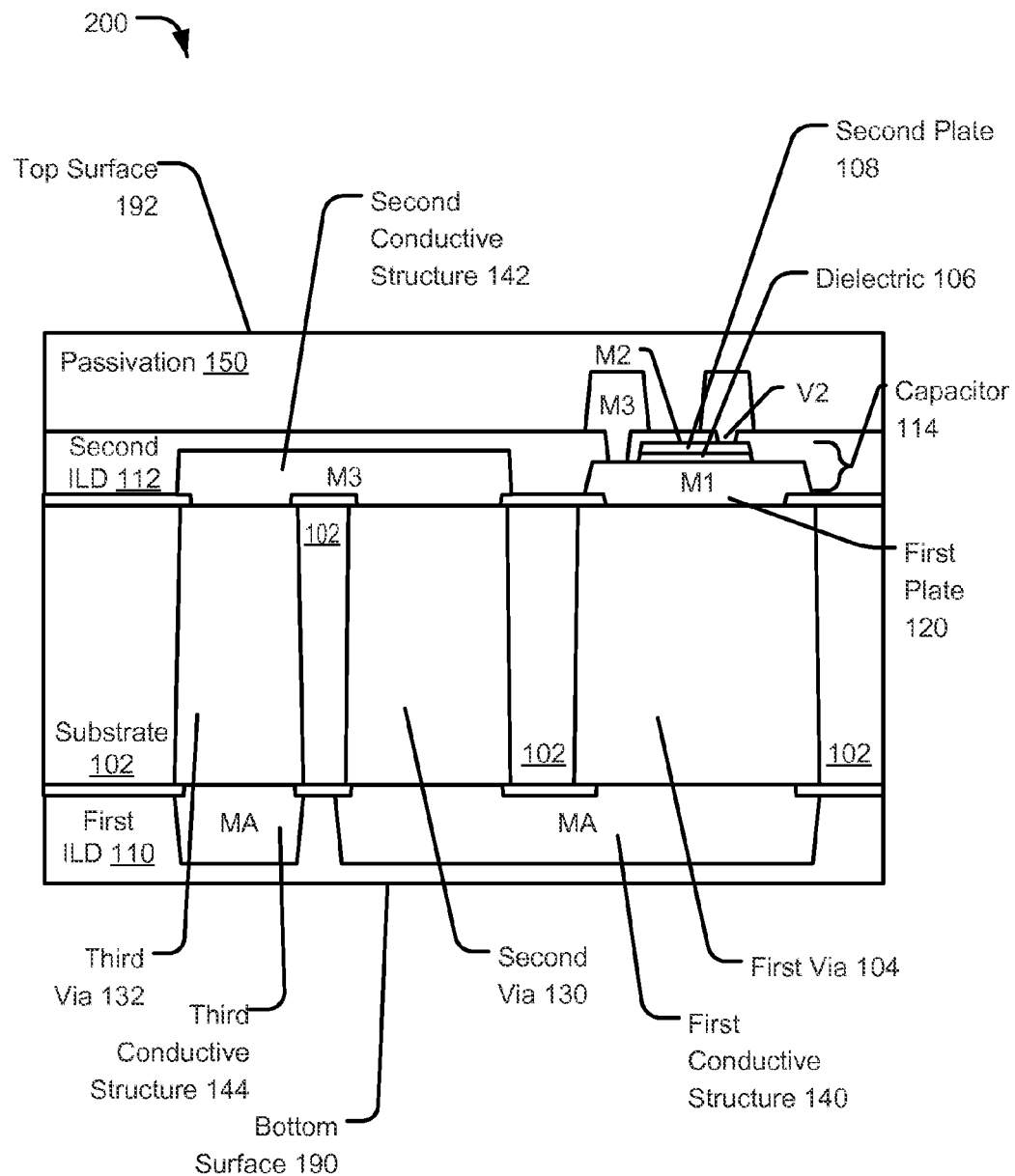
FIG. 2 is a diagram of another particular illustrative embodiment of a circuit including a capacitor with a dielectric between a via and a plate of the capacitor.

Referring to FIG. 2, another particular illustrative embodiment of a circuit including a capacitor with a dielectric between a via and a plate of the capacitor is disclosed. FIG. 2 shows a cross-sectional view of a portion of a device 200 that includes a second circuit.

The device 200 includes the substrate 102 and the first via 104. The device 200 may also include the capacitor 114. The capacitor 114 includes the dielectric 106 between the first via 104 and the second plate 108 of the capacitor 114. As illustrated in FIG. 2, a surface of the first via 104 facing the dielectric 106 may be larger than a surface of the second plate 108. For example, a top surface of the first via 104 may be larger than a bottom surface of the second plate 108. In another particular embodiment, the surface of the first via 104 may be a same size as a surface of the second plate 108 of the capacitor 114. For example, the top surface of the first via 104 may be the same size as the bottom surface of the second plate 108. In another particular embodiment, the surface of the first via 104 may be smaller than a surface of the second plate 108 of the capacitor 114. For example, the top surface of the first via 104 may be smaller than the bottom surface of the second plate 108.

The surface of the first via 104 facing the dielectric 106 being larger than the second plate 108 corresponds to use of a larger first via 104. Use of a larger first via 104 reduces resistance of the second circuit. As a result, the quality factor of the second circuit is increased. A higher quality factor indicates a lower rate of energy loss relative to stored energy of the second circuit.

Figure 3:
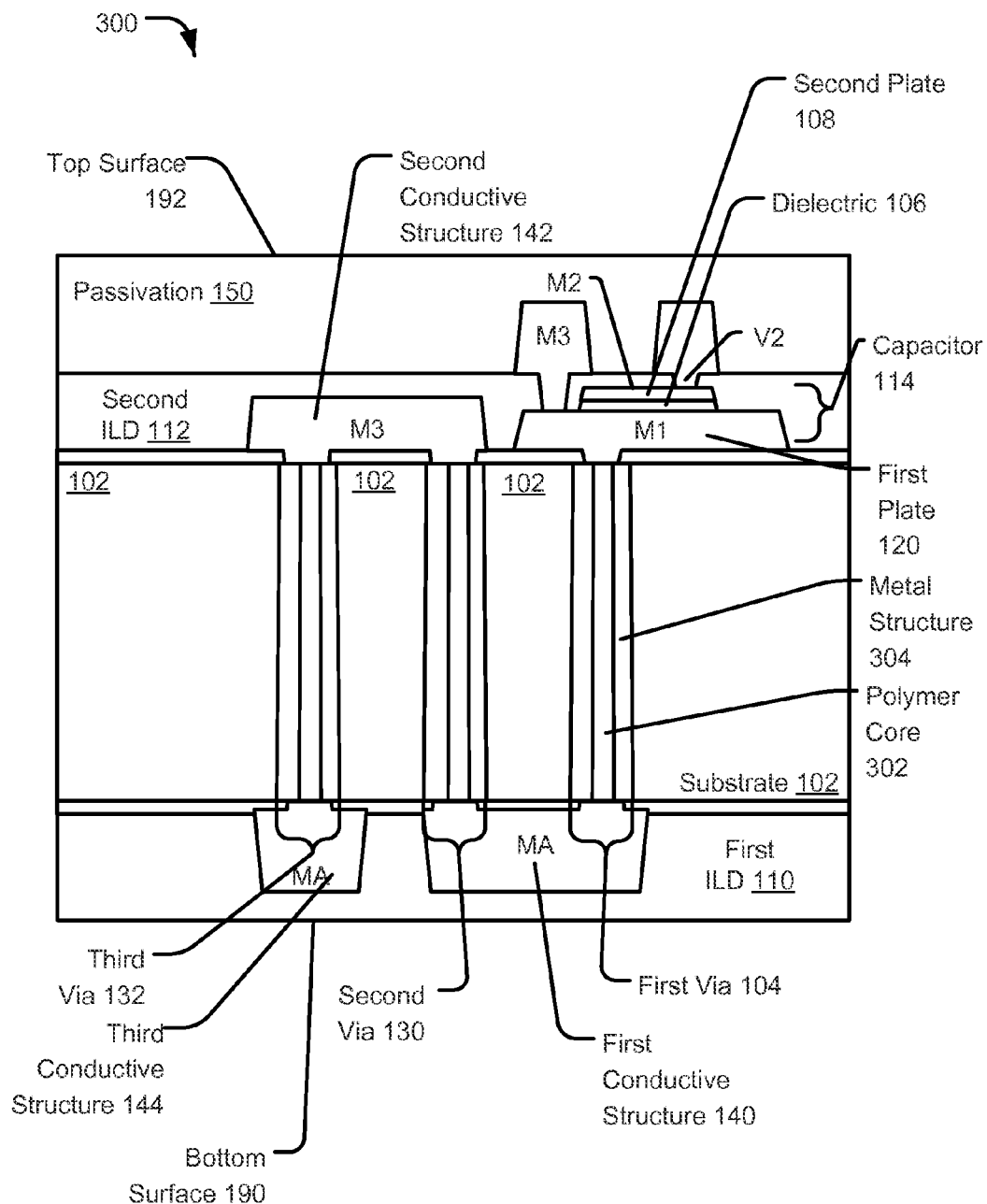
FIG. 3 is a diagram of another particular illustrative embodiment of a circuit including a capacitor with a dielectric between a via and a plate of the capacitor.

Referring to FIG. 3, another particular illustrative embodiment of a circuit including a capacitor with a dielectric between a via and a plate of the capacitor is disclosed. FIG. 3 shows a cross-sectional view of a portion of a device 300 that includes a third circuit.

The device 300 includes the substrate 102 and the first via 104. The device 300 may also include the capacitor 114. The capacitor 114 includes the dielectric 106 between the first via 104 and the second plate 108 of the capacitor 114. As compared to the first via 104 in FIG. 1 that may be entirely metal-filled, the first via 104 in FIG. 3 may include a metal structure 304 with a polymer core 302. The metal structure may include at least one of copper (Cu), tungsten (W), silver (Ag), or gold (Au). The polymer core may include at least one of polyimide (PI), benzocyclobutene (BCB), acrylic, polybenzoxazole (PBO), or photoresist (e.g., TMMR®, SU-8, or other types of photoresists). Having a polymer core 302 may enable the first via 104 to provide structural support to the capacitor 114 and may be more compatible with TGV fabrication techniques than completely filling the first via 104 with metal. In addition, having the polymer core 302 may reduce a material cost of the first via 104, e.g., polymer materials may cost less than metal.

Figure 4:
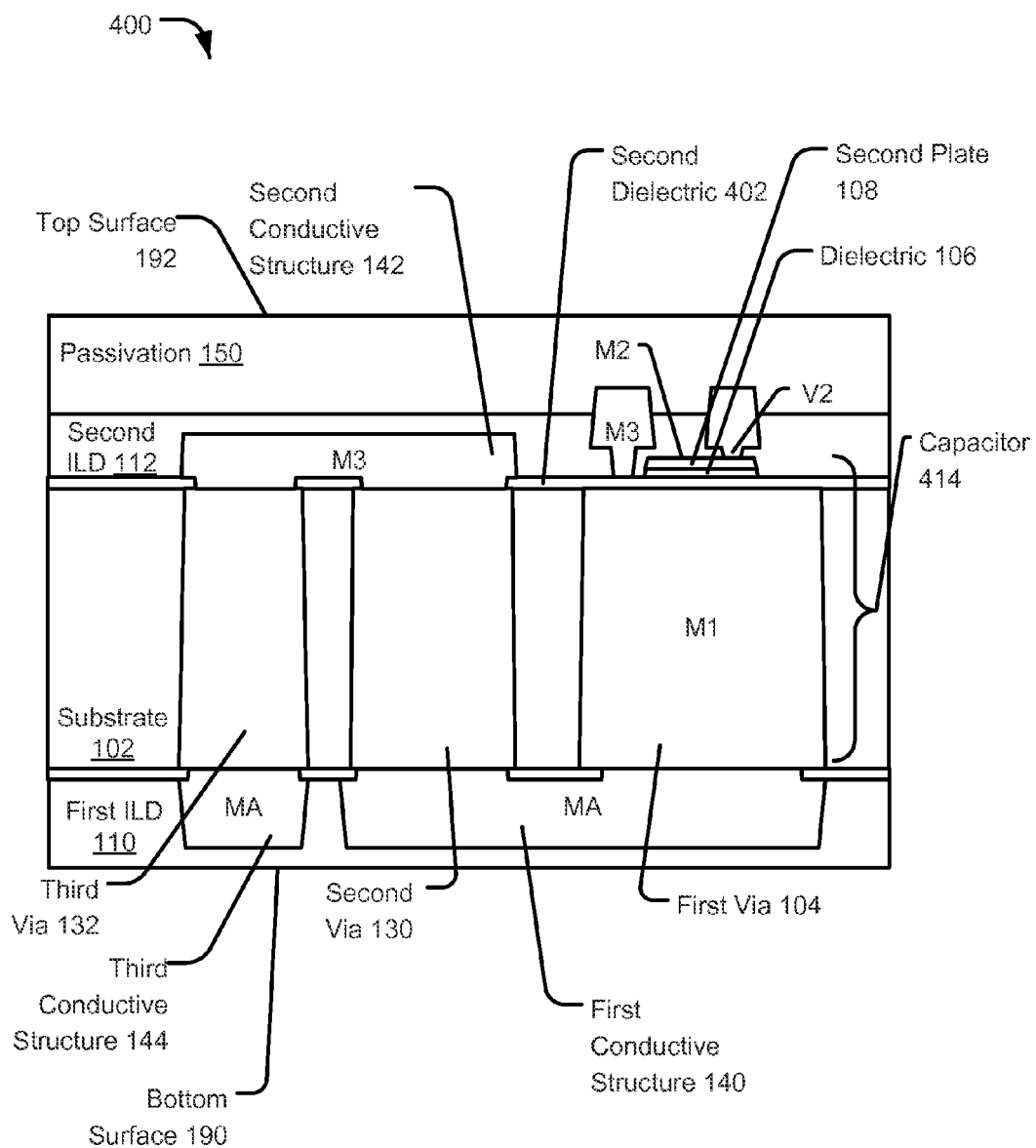
FIG. 4 is a diagram of another particular illustrative embodiment of a circuit including a capacitor with a dielectric between a via and a plate of the capacitor.

Referring to FIG. 4, another particular illustrative embodiment of a circuit including a capacitor with a dielectric between a via and a plate of the capacitor is disclosed. FIG. 4 shows a cross-sectional view of a portion of a device 400 that includes a fourth circuit.

The device 400 includes the substrate 102 and the first via 104. The device 400 may also include a capacitor 414. The capacitor 414 includes the dielectric 106 between the first via 104 and the second plate 108 of the capacitor 414.

As illustrated in FIG. 4, the first via 104 forms a plate of the capacitor 414 and may function as a bottom plate of the capacitor 414. The device 400 may include a second dielectric 402 between the first via 104 and the dielectric 106.

Having the first via 104 function as the bottom plate of the capacitor 414 may reduce a resistance of the fourth circuit as compared to the second circuit of FIG. 2 with the capacitor 114 having the first plate 120 function as the bottom plate. As a result, the quality factor of the fourth circuit may improve, indicating a lower rate of energy loss relative to a stored energy of the fourth circuit. In addition, forming the device 400 may involve fewer lithography stages where the first via 104 functions as the bottom plate of the capacitor 414, as compared to forming the device 200 that may include the first plate 120 (e.g., a first metal layer). Having the first via 104 function as the bottom plate of the capacitor 414 may also reduce a height of the device 400 as compared to the device 200.

Figure 5:
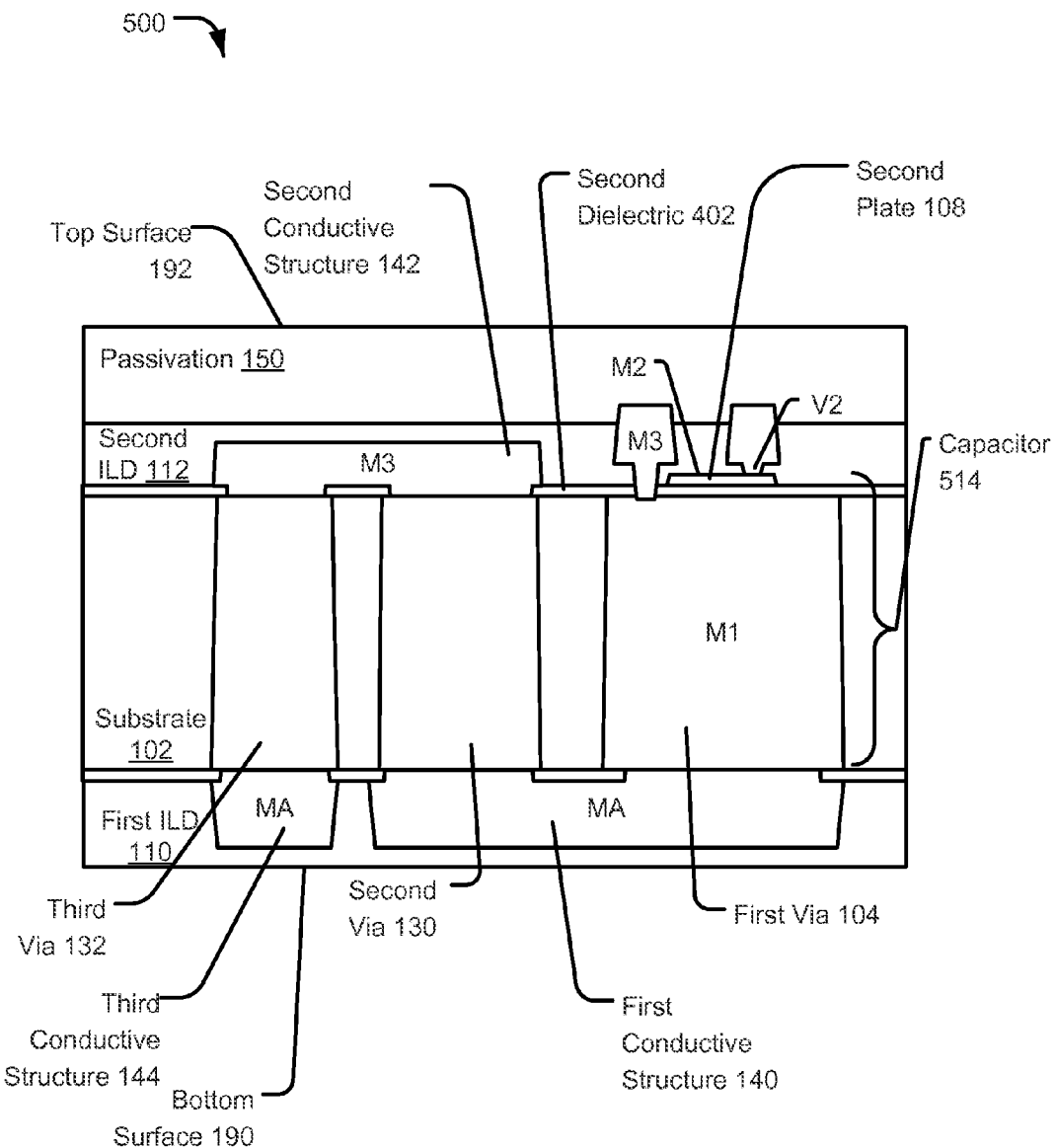
FIG. 5 is a diagram of another particular illustrative embodiment of a circuit including a capacitor with a dielectric between a via and a plate of the capacitor.

Referring to FIG. 5, another particular illustrative embodiment of a circuit including a capacitor with a dielectric between a via and a plate of the capacitor is disclosed. FIG. 5 shows a cross-sectional view of a portion of a wafer that includes a fifth circuit.

The device 500 includes the substrate 102 and the first via 104. The device 500 may also include a capacitor 514.

As compared to the capacitor 414 in FIG. 4 that includes two dielectric layers (i.e., the dielectric 106 and the second dielectric 402), the capacitor 514 in FIG. 5 includes a single dielectric layer (i.e., the second dielectric 402) between the first via 104 and the second plate 108 of the capacitor 514. The second dielectric 402 may include at least one of silicon dioxide (SiO2), silicon nitride (Si3N4), silicon oxynitride (SiOxNy), tantalum pentoxide (Ta2O5), aluminum oxide (Al2O3), or aluminum nitride (AlN).

Having a single dielectric layer (i.e., the second dielectric 402) between the first via 104 and the second plate 108 of the capacitor 514 may reduce a number of lithography stages of forming the device 500, as compared to the device 400 of FIG. 4 with multiple dielectric layers (i.e., the dielectric 106 and the second dielectric 402). As a result, the complexity and cost of fabricating the device 500 may be lower than of fabricating the device 400.

Figure 6:
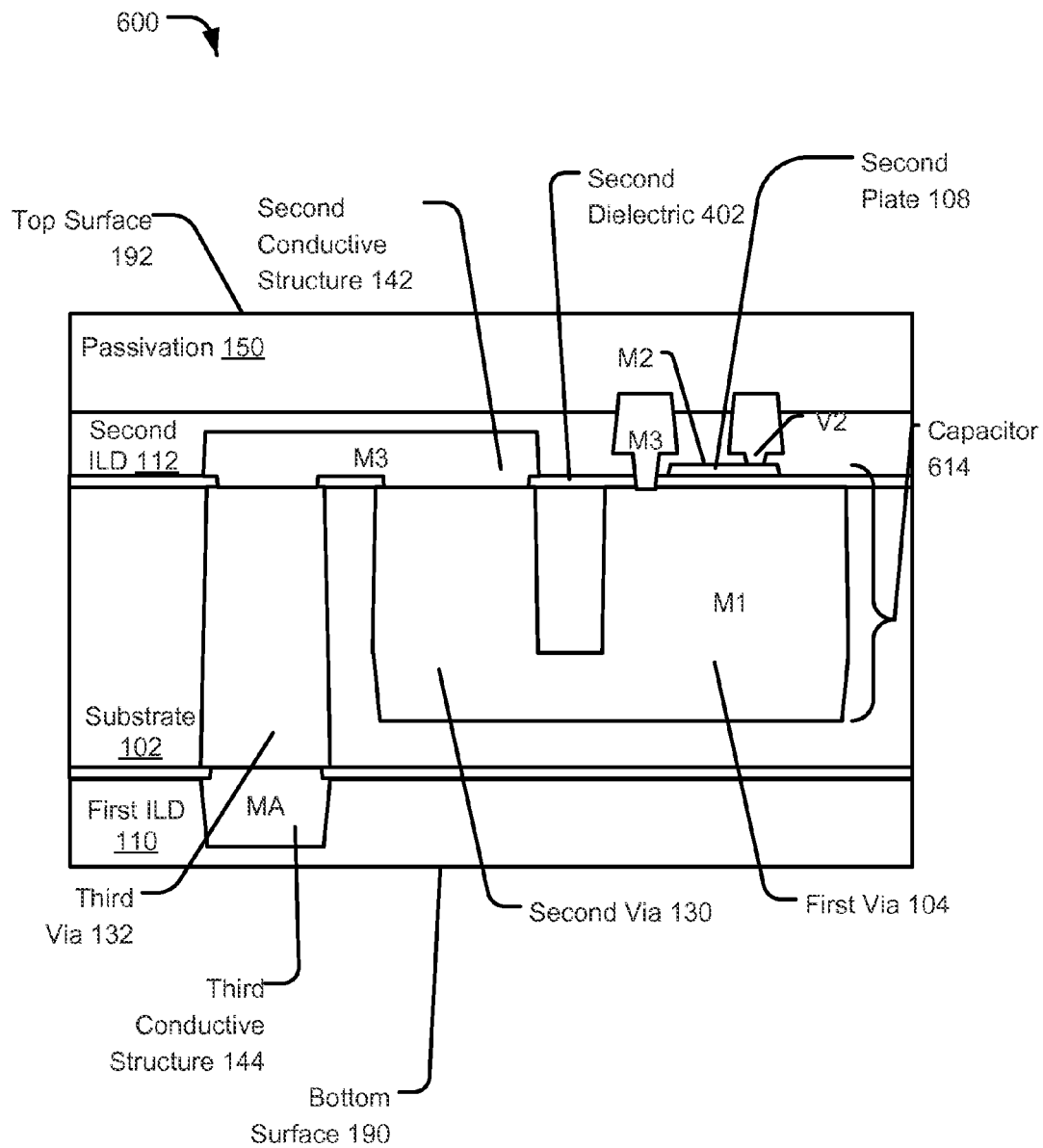
FIG. 6 is a diagram of another particular illustrative embodiment of a circuit including a capacitor with a dielectric between a via and a plate of the capacitor.

Referring to FIG. 6, another particular illustrative embodiment of a circuit including a capacitor with a dielectric between a via and a plate of the capacitor is disclosed. FIG. 6 shows a cross-sectional view of a portion of a device 600 that includes a sixth circuit.

The device 600 includes the substrate 102 and the first via 104. The device 600 may also include a capacitor 614. The capacitor 614 includes the second dielectric 402 between the first via 104 and the second plate 108 of the capacitor 614.

As illustrated in FIG. 6, the first via 104 may extend partially through the substrate 102 and the second via 130 may extend partially through the substrate 102. For example, the first via 104 and the second via 130 may be blind vias that are coupled within the substrate 102 and that do not extend from one side of the substrate 102 to the other side of the substrate 102. The first via 104 and the second via 130 may be joined within the substrate 102.

Having the first via 104 and the second via 130 coupled within the substrate 102 may reduce a resistance of the sixth circuit, such as when a resistance between the first via 104 and the second via 130 is less than a resistance of the first conductive structure 140 coupling the first via 104 and the second via 130 of FIG. 5. As a result, a quality factor of the sixth circuit may improve, indicating a lower rate of energy loss relative to a stored energy of the sixth circuit.

Referring to FIG. 7, a flow chart of a particular illustrative embodiment of a method of forming a circuit including a capacitor having a dielectric between a via and a plate of the capacitor is depicted and generally designated 700.

The method 700 includes forming a via that extends at least partially through a substrate of a device, at 702. For example, as described with reference to FIGS. 1-6, the first via 104 may extend at least partially through the substrate 102. In a particular embodiment, forming the first via 104 may include performing an anisotropic etch process on the substrate 102. In a particular embodiment, the first via 104 may be formed using a slant via formation process, such as the first via 104 of FIG. 6. In a particular embodiment, the first via 104 may be filled with a metal, such as the first via 104 of FIGS. 1-2 and 4-6. In another particular embodiment, the first via 104 may be filled with a metal and a polymer, such as the first via 104 of FIG. 3. The first via 104 may be filled using film deposition processes, such as electroplating, physical vapor deposition (PVD) (e.g., sputtering or evaporation), or chemical vapor deposition (CVD). A conductive paste (e.g., a paste including copper (Cu), tungsten (W), silver (Ag), or gold (Au)) may be used for filling the first via 104. A planarization process may be used to remove unwanted or excess materials and to create a flat surface for subsequent processing. In a particular embodiment, the planarization process may include chemical-mechanical polish (CMP). In another particular embodiment, the planarization process may include an etch-back planarization process.

The method 700 also includes forming a capacitor, at 704, that includes a dielectric between the via and a plate of the capacitor. The plate of the capacitor is external to the substrate and within the device. For example, the capacitor may correspond to the capacitor 114 of FIGS. 1-3, the capacitor 414 of FIG. 4, the capacitor 514 of FIG. 5, or the capacitor 614 of FIG. 6. The capacitor may include the dielectric 106 of FIG. 1-4, the second dielectric 402 of FIG. 4, or both. The second plate 108 is external to the substrate 102 and within the device. For example, the second plate 108 is within the device 100 of FIG. 1, the device 200 of FIG. 2, the device 300 of FIG. 3, the device 400 of FIG. 4, the device 500 of FIG. 5, or the device 600 of FIG. 6.

The method of FIG. 7 may be implemented by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the method 700 of FIG. 7 may be performed by a processor that executes instructions, as described with respect to FIG. 8. As another example, the method 700 of FIG. 7 may be performed by fabrication equipment, such as a processor that executes instructions stored at a memory (e.g., a non-transitory computer-readable medium), as described further with reference to FIG. 9.

Referring to FIG. 8, a block diagram of a particular illustrative embodiment of a wireless communication device is depicted and generally designated 800. The device 800 includes a processor 810, such as a digital signal processor (DSP), coupled to a memory 832 (e.g., a random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art). The memory 832 may store instructions 862 executable by the processor 810. The memory 832 may store data 866 accessible to the processor 810.

The device 800 includes a capacitor 864 with a dielectric between a via and a plate of the capacitor. In an illustrative embodiment, the capacitor 864 may correspond to the capacitor 114 of FIGS. 1-3, the capacitor 414 of FIG. 4, the capacitor 514 of FIG. 5, the capacitor 614 of FIG. 6, a capacitor formed according to the method 700 of FIG. 7, or a combination thereof. For example, as depicted in FIG. 8, a radio frequency (RF) interface 852 may include the capacitor 864.

FIG. 8 also shows a display controller 826 that is coupled to the processor 810 and to a display 828. A coder/decoder (CODEC) 834 may also be coupled to the processor 810. A speaker 836 and a microphone 838 may be coupled to the CODEC 834. FIG. 8 also indicates that a wireless controller 840 may be coupled to the processor 810 and may be further coupled to a wireless antenna 842 via the RF interface 852.

In a particular embodiment, the processor 810, the display controller 826, the memory 832, the CODEC 834, and the wireless controller 840 are included in a system-in-package or system-on-chip device 822. In a particular embodiment, an input device 830 and a power supply 844 are coupled to the system-on-chip device 822. Moreover, in a particular embodiment, as illustrated in FIG. 8, the display 828, the input device 830, the speaker 836, the microphone 838, the wireless antenna 842, and the power supply 844 are external to the system-on-chip device 822. However, each of the display 828, the input device 830, the speaker 836, the microphone 838, the wireless antenna 842, and the power supply 844 may be coupled to a component of the system-on-chip device 822, such as an interface or a controller.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include wafers that are then cut into die and packaged into a chip. The chips are then integrated into electronic devices, as described further with reference to FIG. 9.

Referring to FIG. 9, a particular illustrative embodiment of an electronic device manufacturing process is depicted and generally designated 900. In FIG. 9, physical device information 902 is received at the manufacturing process 900, such as at a research computer 906. The physical device information 902 may include design information representing at least one physical property of a device, such as a capacitor with a dielectric between a via and a plate of the capacitor (e.g., the capacitor 114 of FIGS. 1-3, the capacitor 414 of FIG. 4, the capacitor 514 of FIG. 5, the capacitor 614 of FIG. 6, and/or a capacitor formed according to the method 700 of FIG. 7). For example, the physical device information 902 may include physical parameters, material characteristics, and structure information that is entered via a user interface 904 coupled to the research computer 906. The research computer 906 includes a processor 908, such as one or more processing cores, coupled to a computer readable medium such as a memory 910. The memory 910 may store computer readable instructions that are executable to cause the processor 908 to transform the physical device information 902 to comply with a file format and to generate a library file 912.

In a particular embodiment, the library file 912 includes at least one data file including the transformed design information. For example, the library file 912 may include a library of circuits including a capacitor (e.g., the capacitor 114 of FIGS. 1-3, the capacitor 414 of FIG. 4, the capacitor 514 of FIG. 5, the capacitor 614 of FIG. 6, and/or a capacitor formed according to the method 700 of FIG. 7) provided for use with an electronic design automation (EDA) tool 920.

The library file 912 may be used in conjunction with the EDA tool 920 at a design computer 914 including a processor 916, such as one or more processing cores, coupled to a memory 918. The EDA tool 920 may be stored as processor executable instructions at the memory 918 to enable a user of the design computer 914 to design a circuit including the device (e.g., the capacitor 114 of FIGS. 1-3, the capacitor 414 of FIG. 4, the capacitor 514 of FIG. 5, the capacitor 614 of FIG. 6, and/or a capacitor formed according to the method 700 of FIG. 7) using the library file 912. For example, a user of the design computer 914 may enter circuit design information 922 via a user interface 924 coupled to the design computer 914. The circuit design information 922 may include design information representing at least one physical property of a circuit (e.g., the capacitor 114 of FIGS. 1-3, the capacitor 414 of FIG. 4, the capacitor 514 of FIG. 5, the capacitor 614 of FIG. 6, and/or a capacitor formed according to the method 700 of FIG. 7). To illustrate, the circuit design property may include identification of particular circuits and relationships to other elements in a circuit design, positioning information, feature size information, interconnection information, or other information representing a physical property of a device.

The design computer 914 may be configured to transform the design information, including the circuit design information 922, to comply with a file format. To illustrate, the file formation may include a database binary file format representing planar geometric shapes, text labels, and other information about a circuit layout in a hierarchical format, such as a Graphic Data System (GDSII) file format. The design computer 914 may be configured to generate a data file including the transformed design information, such as a GDSII file 926 that includes information describing a capacitor (e.g., the capacitor 114 of FIGS. 1-3, the capacitor 414 of FIG. 4, the capacitor 514 of FIG. 5, the capacitor 614 of FIG. 6, and/or a capacitor formed according to the method 700 of FIG. 7) in addition to other circuits or information. To illustrate, the data file may include information corresponding to a system-on-chip (SOC) that includes a capacitor (e.g., the capacitor 114 of FIGS. 1-3, the capacitor 414 of FIG. 4, the capacitor 514 of FIG. 5, the capacitor 614 of FIG. 6, and/or a capacitor formed according to the method 700 of FIG. 7), and that also includes additional electronic circuits and components within the SOC.

The GDSII file 926 may be received at a fabrication process 928 to manufacture a capacitor (e.g., the capacitor 114 of FIGS. 1-3, the capacitor 414 of FIG. 4, the capacitor 514 of FIG. 5, the capacitor 614 of FIG. 6, and/or a capacitor formed according to the method 700 of FIG. 7), according to transformed information in the GDSII file 926. For example, a device manufacture process may include providing the GDSII file 926 to a mask manufacturer 930 to create one or more masks, such as masks to be used with photolithography processing, illustrated as a representative mask 932. The mask 932 may be used during the fabrication process to generate one or more wafers 934, which may be tested and separated into dies, such as a representative die 936. The die 936 includes a capacitor (e.g., the capacitor 114 of FIGS. 1-3, the capacitor 414 of FIG. 4, the capacitor 514 of FIG. 5, the capacitor 614 of FIG. 6, and/or a capacitor formed according to the method 700 of FIG. 7).

In conjunction with the described embodiments, a non-transitory computer-readable medium stores instructions executable by a computer to perform the method 700 of FIG. 7. For example, equipment of a manufacturing plant may include the computer and the memory and may perform the method 700 of FIG. 7, such as in connection with the fabrication process 928 and using the GSDII file 926. To illustrate, the computer may execute instructions to initiate forming a via that extends at least partially through a substrate and forming a capacitor, as described with reference to FIG. 7.

The die 936 may be provided to a packaging process 938 where the die 936 is incorporated into a representative package 940. For example, the package 940 may include the single die 936 or multiple dies, such as a system-in-package (SiP) arrangement. The package 940 may be configured to conform to one or more standards or specifications, such as Joint Electron Device Engineering Council (JEDEC) standards.

Information regarding the package 940 may be distributed to various product designers, such as via a component library stored at a computer 946. The computer 946 may include a processor 948, such as one or more processing cores, coupled to a memory 950. A printed circuit board (PCB) tool may be stored as processor executable instructions at the memory 950 to process PCB design information 942 received from a user of the computer 946 via a user interface 944. The PCB design information 942 may include physical positioning information of a packaged device on a circuit board, the packaged device corresponding to the package 940 including a capacitor (e.g., the capacitor 114 of FIGS. 1-3, the capacitor 414 of FIG. 4, the capacitor 514 of FIG. 5, the capacitor 614 of FIG. 6, and/or a capacitor formed according to the method 700 of FIG. 7).

The computer 946 may be configured to transform the PCB design information 942 to generate a data file, such as a GERBER file 952 with data that includes physical positioning information of a packaged device on a circuit board, as well as layout of electrical connections such as traces and vias, where the packaged device corresponds to the package 940 including a capacitor (e.g., the capacitor 114 of FIGS. 1-3, the capacitor 414 of FIG. 4, the capacitor 514 of FIG. 5, the capacitor 614 of FIG. 6, and/or a capacitor formed according to the method 700 of FIG. 7). In other embodiments, the data file generated by the transformed PCB design information may have a format other than a GERBER format.

The GERBER file 952 may be received at a board assembly process 954 and used to create PCBs, such as a representative PCB 956, manufactured in accordance with the design information stored within the GERBER file 952. For example, the GERBER file 952 may be uploaded to one or more machines to perform various steps of a PCB production process. The PCB 956 may be populated with electronic components including the package 940 to form a representative printed circuit assembly (PCA) 958.

The PCA 958 may be received at a product manufacture process 960 and integrated into one or more electronic devices, such as a first representative electronic device 962 and a second representative electronic device 964. As an illustrative, non-limiting example, the first representative electronic device 962, the second representative electronic device 964, or both, may be selected from the group of a cellular phone, a wireless local area network (LAN) device, a set top box, a music player, a video player, an entertainment unit, a navigation device, a communications device, a personal digital assistant (PDA), a fixed location data unit, and a computer, into which a capacitor (e.g., the capacitor 114 of FIGS. 1-3, the capacitor 414 of FIG. 4, the capacitor 514 of FIG. 5, the capacitor 614 of FIG. 6, and/or a capacitor formed according to the method 700 of FIG. 7) is integrated. As another illustrative, non-limiting example, one or more of the electronic devices 962 and 964 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 8 illustrates remote units according to teachings of the disclosure, the disclosure is not limited to these illustrated units. Embodiments of the disclosure may be suitably employed in any device which includes active integrated circuitry including memory and on-chip circuitry.

A device that includes a capacitor (e.g., the capacitor 114 of FIGS. 1-3, the capacitor 414 of FIG. 4, the capacitor 514 of FIG. 5, the capacitor 614 of FIG. 6, and/or a capacitor formed according to the method 700 of FIG. 7) may be fabricated, processed, and incorporated into an electronic device, as described in the illustrative process 900. One or more aspects of the embodiments disclosed with respect to FIGS. 1-9 may be included at various processing stages, such as within the library file 912, the GDSII file 926, and the GERBER file 952, as well as stored at the memory 910 of the research computer 906, the memory 918 of the design computer 914, the memory 950 of the computer 946, the memory of one or more other computers or processors (not shown) used at the various stages, such as at the board assembly process 954, and also incorporated into one or more other physical embodiments such as the mask 932, the die 936, the package 940, the PCA 958, other products such as prototype circuits or devices (not shown), or any combination thereof. Although various representative stages are depicted with reference to FIGS. 1-9, in other embodiments fewer stages may be used or additional stages may be included. Similarly, the process 900 of FIG. 9 may be performed by a single entity or by one or more entities performing various stages of the process 900.

In conjunction with the described embodiments, an apparatus is disclosed that includes means for storing charge. For example, the means for storing charge may include the capacitor of FIGS. 1-6. The means for storing charge may include a dielectric. For example, the dielectric may include the dielectric 106 of FIG. 1, the second dielectric 402 of FIG. 4, or a combination thereof.

The apparatus also includes means for conducting current. The means for conducting current may extend at least partially through a substrate. The dielectric may be located between the means for conducting current and a plate of the means for storing charge. The plate may be external to the substrate and within the apparatus. For example, the means for conducting current may include a via, such as the first via 104 of any of FIGS. 1-6.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor may read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A device comprising:
   a substrate;
   a first via that extends only partially through the substrate;
   a second via that extends only partially through the substrate and that is joined to the first via within the substrate;
   a multi-via inductor that includes a conductive structure coupled to the first via and to the second via; and
   a capacitor coupled to the first via, wherein a dielectric of the capacitor is located between the first via and a plate of the capacitor, and wherein the plate of the capacitor is external to the substrate.

2. The device of claim 1, wherein the conductive structure includes a first conductive structure, and wherein the capacitor is coupled to the first conductive structure by the first via.

3. The device of claim 2, wherein the multi-via inductor further includes a second part of the multi via inductor; and a second conductive structure, and wherein the first conductive structure is coupled to the second conductive structure by the second via.

4. The device of claim 1, wherein the plate is in an inter-layer dielectric (ILD) layer, and wherein a resonant circuit includes the multi-via inductor and the capacitor.

5. The device of claim 1, wherein the substrate comprises a glass-type substrate, and wherein the first via comprises a through-glass-via.

6. The device of claim 1, wherein:
   the substrate comprises a glass substrate, a quartz substrate, a silicon-on-insulator (SOI) substrate, a silicon-on-sapphire (SOS) substrate, a high resistivity substrate (HRS), a gallium arsenide (GaAs) substrate, an indium phosphide (InP) substrate, a silicon carbide (SiC) substrate, an aluminum nitride (AlN) substrate, rogers laminates, or a plastic substrate;
   the first via is a metal-filled via, the metal including at least one of copper (Cu), tungsten (W), silver (Ag), or gold (Au); and the dielectric comprises at least one of silicon dioxide (SiO2), silicon nitride (Si3N4), silicon oxynitride (SiOxNy), tantalum pentoxide (Ta2O5), aluminum oxide (Al2O3), or aluminum nitride (AlN).

7. The device of claim 1, further comprising a metal structure within the first via, the metal structure comprising a polymer core.

8. The device of claim 1, wherein at least a part of the plate of the capacitor and at least a part of the dielectric of the capacitor are vertically above at least a part of a dielectric-facing surface of the first via.

9. The device of claim 2, wherein the capacitor is adjacent to a first surface of the substrate, wherein the first conductive structure is adjacent to a second surface of the substrate that is opposite to the first surface, and wherein an axis that extends through the first via and is orthogonal to a plane of a second surface of the substrate intersects the plate of the capacitor, the dielectric of the capacitor, and the first conductive structure.

10. The device of claim 1, wherein the first via extends at least partially through the substrate along a direction approximately normal to a surface of the substrate, and wherein an axis of the first via that is approximately normal to the surface of the substrate intersects a region of the plate.

11. The device of claim 1, wherein a dielectric-facing surface of the first via is larger than a surface of the plate of the capacitor.

12. The device of claim 1, wherein a dielectric-facing surface of the first via is a same size as a surface of the plate of the capacitor.

13. The device of claim 1, wherein a dielectric-facing surface of the first via is smaller than a surface of the plate of the capacitor.

14. The device of claim 1, wherein a second dielectric of the capacitor is located between the first via and the dielectric.

15. The device of claim 1, wherein the multi-via inductor further includes the first via, the second via, and a third via that extends at least partially through the substrate.

16. The device of claim 1, wherein at least part of the plate of the capacitor and at least a part of the dielectric of the capacitor are positioned vertically over at least a part of the first via.

17. An apparatus comprising:
means for storing charge, the means for storing charge comprising a dielectric;
first means for conducting current, the first means for conducting current coupled to the means for storing charge, the first means for conducting current extending only partially through a substrate; and
second means for conducting current, the second means for conducting current extending only partially through the substrate and joined to the first means for conducting current within the substrate, the first means for conducting current and the second means for conducting current forming part of a multi-via inductor that includes a conductive structure coupled to the first means for conducting current and to the second means for conducting current, wherein the dielectric is located between the first means for conducting current and a plate of the means for storing charge, and wherein the plate is external to the substrate.

18. The apparatus of claim 17, wherein the means for storing charge includes a capacitor, and wherein the first means for conducting current includes a via.

19. The apparatus of claim 17, wherein the means for storing charge is coupled to the conductive structure of the multi-via inductor by the first means for conducting current, and wherein the conductive structure of the multi-via inductor is coupled to a second conductive structure of the multi-via inductor by the second means for conducting current.

20. The apparatus of claim 17, further comprising a device selected from a cellular phone, a wireless local area network (LAN) device, a set top box, a music player, a video player, an entertainment unit, a navigation device, a communications device, a personal digital assistant (PDA), a fixed location data unit, and a computer, into which the means for storing charge, the first means for conducting current, and the second means for conducting current are integrated.

21. A computer-readable storage device storing instructions that, when executed by a processor cause the processor to:
initiate formation of a first via that extends only partially through a substrate of an integrated circuit;
initiate formation of a second via that extends only partially through the substrate and that is joined to the first via within the substrate;
initiate formation of a multi-via inductor that includes a conductive structure coupled to the first via and to the second via; and
initiate formation of a capacitor coupled to the first via, wherein a dielectric of the capacitor is located between the first via and a plate of the capacitor, and wherein the plate of the capacitor is external to the substrate and within the integrated circuit.

22. The computer-readable storage device of claim 21, wherein the processor is integrated into an electronic device.

23. A device comprising:
a plurality of vias extending partially through a substrate and forming part of an inductor that includes a conductive structure coupled to at least two vias of the plurality of vias, the at least two vias extending only partially through the substrate and including a first via and a second via that is joined to the first via within the substrate; and
a capacitor coupled to the first via and including:
a plate external to the substrate; and
a dielectric between the plate and the first via.

24. The device of claim 23, wherein the inductor further includes a third via that extends at least partially through the substrate.

25. The device of claim 23, wherein the conductive structure includes a first conductive structure that is coupled to the capacitor by the first via.

26. The device of claim 25, wherein the inductor comprises a second conductive structure coupled by the second via to the first conductive structure.

27. The device of claim 25, wherein:
the capacitor is adjacent to a first surface of the substrate,
the first conductive structure is adjacent to a second surface of the substrate opposite to the first surface, and
an axis of the first via orthogonal to a plane of a first surface of the substrate intersects the plate of the capacitor, the dielectric of the capacitor, and the first conductive structure.

28. The device of claim 23, further comprising a resonant circuit that includes the inductor and the capacitor.

29. The device of claim 23, wherein the first via is substantially internal to the substrate, and wherein at least part of the plate of the capacitor and at least a part of the dielectric of the capacitor are positioned vertically over at least a part of the first via.

30. A device comprising:
- a first via extending only partially through a substrate, an axis of the first via approximately normal to a surface of the substrate;
- a second via extending only partially through the substrate and joined to the first via within the substrate;
- a multi-via inductor that includes a conductive structure coupled to the first via and to the second via; and
- a capacitor coupled to the substrate and including a plate and a dielectric intersected by the axis.

31. The device of claim 30, further comprising a polymer core that partially fills an interior of the first via or a metal structure that substantially fills the interior of the first via.

32. The device of claim 30, wherein the capacitor is coupled to the first via.

33. The device of claim 30, wherein the dielectric is between the first via and the plate, and wherein the plate of the capacitor is external to the substrate.

34. A method comprising:
- generating a first signal using a plurality of vias that extend through a substrate of an integrated circuit and that form part of an inductor that includes a conductive structure coupled to at least two vias of the plurality of vias, the at least two vias extending only partially through the substrate and including a first via and a second via that is joined to the first via within the substrate; and
- generating a second signal using a capacitor that is coupled to the first via and that includes a plate external to the substrate and a dielectric between the plate and the first via.

35. The method of claim 34, wherein generating the first signal and generating the second signal are initiated by a processor that is integrated into an electronic device.

* * * * *